United States Patent
Roberts

(10) Patent No.: US 7,930,435 B2
(45) Date of Patent: Apr. 19, 2011

(54) HUB AND SPOKE COMPRESSION

(75) Inventor: Kim B. Roberts, Nepean (CA)

(73) Assignee: Ciena Corporation, Linthicum, MD (US)

( * ) Notice: Subject to any disclaimer, the term of this patent is extended or adjusted under 35 U.S.C. 154(b) by 126 days.

(21) Appl. No.: 12/114,059

(22) Filed: May 2, 2008

(65) Prior Publication Data

US 2008/0281984 A1 Nov. 13, 2008

Related U.S. Application Data

(60) Provisional application No. 60/916,934, filed on May 9, 2007.

(51) Int. Cl.
*G06F 15/16* (2006.01)
(52) U.S. Cl. ..................................... 709/247
(58) Field of Classification Search .................. 709/247, 709/227, 228
See application file for complete search history.

(56) References Cited

U.S. PATENT DOCUMENTS

| | | | | |
|---|---|---|---|---|
| 6,985,442 B1 * | 1/2006 | Wang et al. | ................... | 370/232 |
| 7,508,803 B2 * | 3/2009 | Emeott et al. | ................. | 370/338 |

* cited by examiner

*Primary Examiner* — Frantz B Jean
(74) *Attorney, Agent, or Firm* — Kent Daniels; Blake, Cassels & Graydon LLP

(57) ABSTRACT

A method of compressing data traffic for transmission through a network, the method comprises computing, for each one of a plurality of contexts of data traffic within the network, a respective optimal dictionary for encoding data traffic; For each block of data to be transmitted through the network: identifying a block context of the block of data; and encoding the block of data using the respective dictionary computed for the context corresponding to the identified block context.

12 Claims, 2 Drawing Sheets

HUB AND SPOKE COMPRESSION

CROSS-REFERENCE TO RELATED APPLICATIONS

This application is based on, and claims benefit under 35 U.S.C. §120 of, Provisional U.S. Patent Application No. 60/916,934 filed May 9, 2007, the entire content of which is hereby incorporated herein by reference.

TECHNICAL FIELD

The present invention relates to communications networks, and in particular to methods and systems for data compression in a communications network having a star topology.

BACKGROUND OF THE INVENTION

Communications network having a star topology are well known in the art. In such networks, a plurality of nodes are connected to a central hub which may, for example be provided as a switch, router, or a computer. In enterprise networks, the number of nodes can become very large. A disadvantage of this arrangement is that, because all of the network traffic is forced to traverse the hub, the routing capacity of the hub can become a limiting factor on the overall performance of the network.

In order to address this challenge, various methods have been proposed for compressing the data traffic prior to transmission through the network. Well known data compression techniques include Run-length encoding and Huffman encoding. In some cases, a Burrows-Wheeler transform is used to increase the compression efficiency of run-length encoding. All of these techniques utilize characteristics of the data traffic itself to determine the data compression.

The Burrows-Wheeler transform reversibly permutes the order of symbols (or characters) in a file in such a way that the transformed file contains symbol sequences in which the same symbol is repeated multiple times. While the Burrows-Wheeler transform does not itself reduce the size of the data file, the transformed file is more amenable to data compression using, for example, Run-Length Encoding.

Run-Length Encoding is a data-compression technique in which in which runs of symbols (that is, sequences in which the same symbol occurs multiple times in series) are stored as a single symbol value and a count, rather than as the original run of symbols. This technique is most useful on data that contains many such runs: for example, relatively simple graphic images such as icons, line drawings and animations. The Burrows-Wheeler transform tends to produce multiple symbol runs within the transformed data file, and so can be used to improve compression efficiency of Run-Length Encoding.

Huffman Encoding is an entropy encoding algorithm used for lossless data compression, in which a variable-length code table (or dictionary) is used for encoding each symbol of a source file. The dictionary is generated using the expected frequency of occurrence of each symbol in the source file. In some cases, the dictionary is generated by analysing the frequency of occurrence of symbols in the source file itself. In order to facilitate decoding of the Huffman encoded file, the dictionary is normally appended to the encoded file, which tends to reduce the compression efficiency.

Accordingly, techniques that enable efficient data compression in a network remain highly desirable.

SUMMARY OF THE INVENTION

The present invention addresses the above-noted problems by providing a technique enable efficient data compression in a network.

Thus, an aspect of the present invention provides a method of compressing data traffic for transmission through a network, the method comprises computing, for each one of a plurality of contexts of data traffic within the network, a respective optimal dictionary for encoding data traffic; For each block of data to be transmitted through the network: identifying a block context of the block of data; and encoding the block of data using the respective dictionary computed for the context corresponding to the identified block context.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
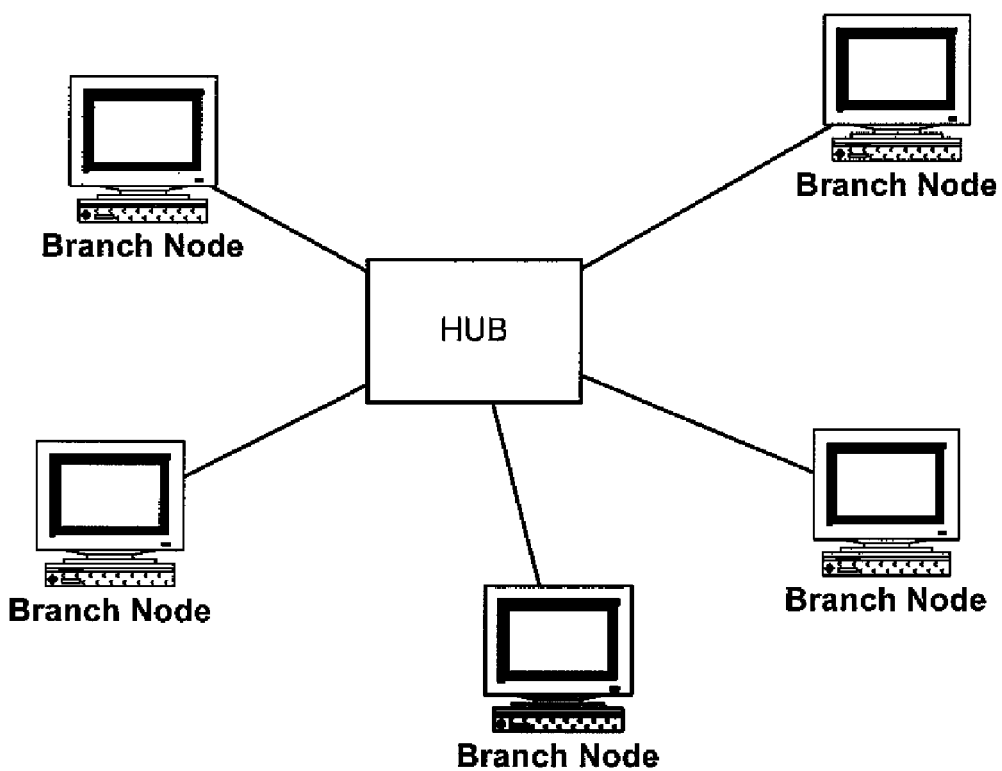
FIG. 1 is a block diagram schematically illustrating a network in which methods in accordance with the present invention may be implemented.

The present invention provides techniques for enable efficient data compression in a network. For the purposes of convenience, the present invention is described with reference to a representative example in which the network has a star topology. However, it should be understood that the present invention is not limited to any particular network topology, but may in fact be implemented in a network having an desired topology. Embodiments of the present invention are described below, by way of example only, with reference to FIGS. 1-2.

In very general terms, the present invention provides a technique in which the compression of network traffic is optimized based on context. In operation, the data traffic within the network is analysed to identify each one of a plurality of contexts, and data compression optimized for each identified context. Once compression has been optimized for any given context, all of the network data traffic conforming to that context is subsequently compressed using that optimization. Thus, for example, in an embodiment in which data compression is performed using Huffman Encoding, optimization of data compression for any given context may be accomplished by computing a respective encoding dictionary. Once the dictionary has been computed, it can be transmitted to each of the nodes of the network and subsequently used to compress data traffic conforming to that context.

With this arrangement, the number of different compression optimizations (e.g. encoding dictionaries) that must be maintained by the network will normally equal the number of different identified contexts. In some embodiments, this will be significantly less than the number of dictionaries that would be required in conventional systems.

In the present application, the term "context" relates to a property of the data traffic that reflects the nature of its content, but is not strictly dependent on the specific content of any particular data file.

For example, text files containing English-language text tend to exhibit certain similarities, due to the nature of their content (i.e. English language text), independently of the specific content (e.g. the subject matter) of any given text file. Thus, in some embodiments the context may include a file type (or category) Representative categories that may be used to define context include, but are not limited to, those set out below in table 1.

TABLE 1

| Category | Examples |
| --- | --- |
| biological and medical data | Genome data |
| database chunks | Oracle ™ database |
| machine executables | *.exe files |
| images and pictures | JPEG, MPEG, bit-mapped images |
| Presentation | MS PowerPoint ™ files |
| text files | books, articles |
| binary data | MS Excel ™ files |
| mixed text and binary | |

As may be appreciated, in embodiments in which the data type (category) is used to define context, different contexts can be identified by examination of file names and/or metadata normally attached to each file by the application(s) used to create and edit each file.

In some embodiments, it may be desirable to define the context with a finer granularity than the data type (category). More particularly, within each category, data traffic may fall within a limited number of sub-groups having similar characteristics. For example, consider network traffic composed of text files. As noted above, all text files within the network will exhibit at least some degree of self-similarity, by virtue of containing English-language text, for example. However, within this category, text files that relate to a common topic, for example, will exhibit a greater degree of self-similarity than text files that do not. As will be described in greater detail below, the self-similarity of data traffic within the network can be detected and used, either alone or in combination with the traffic category, to define context.

Figure 2:
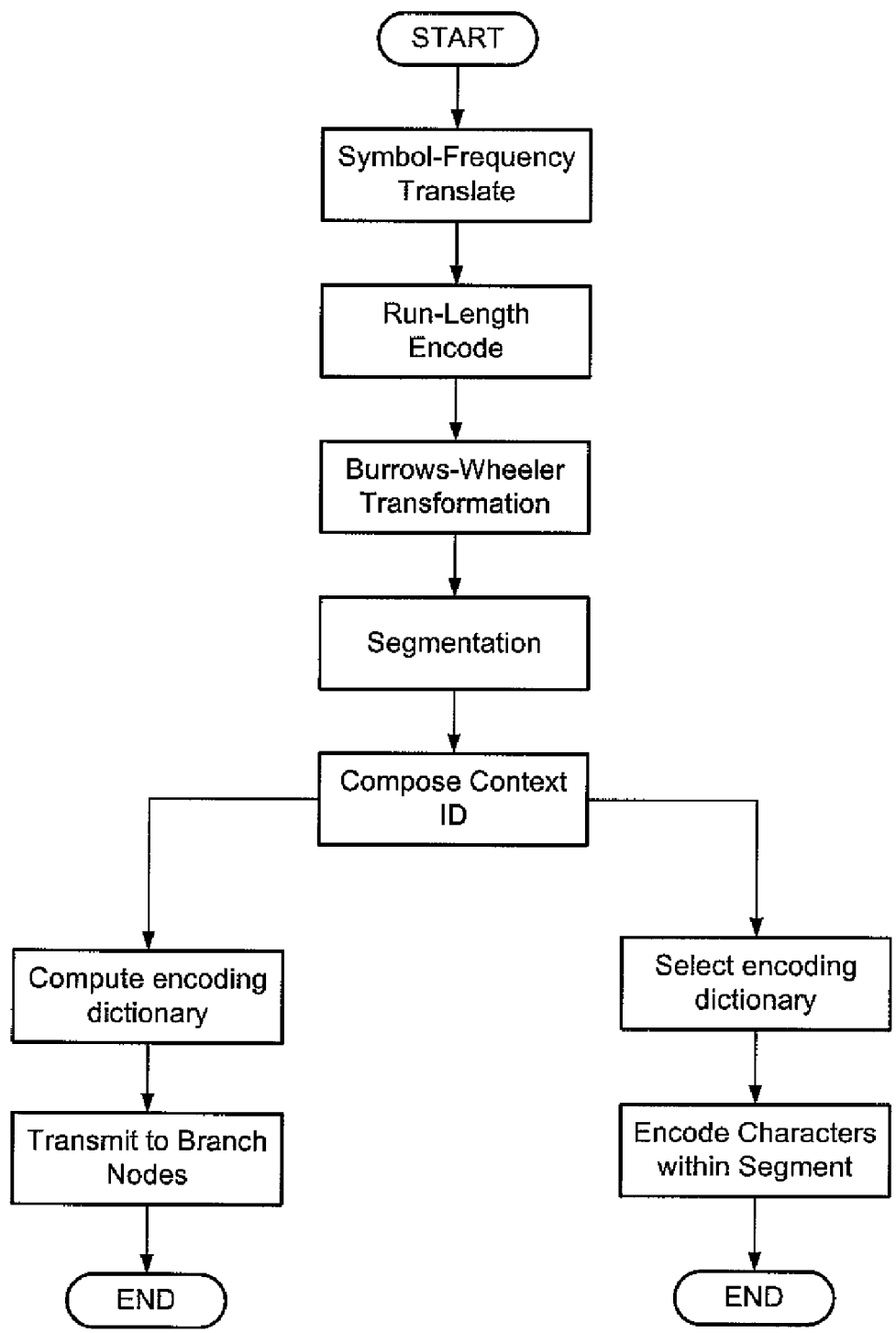
FIG. 2 is a flow chart schematically illustrating principal steps in method in accordance with the present invention.

FIG. 2 is a flow chart illustrating a representative process for identifying context based on self-similarity of data traffic. In the embodiment of FIG. 2, a received data block, which may be a data file or the payload of a network data packet, is processed by symbol-frequency translating the block of data using a predetermined frequency table; Run-Length encoding the translated data block, and then Burrows-Wheeler transforming the Run-Length Encoded data block.

Symbol-frequency translation of the received data involves scanning the raw (that is, un-encoded) data and replacing each symbol with a selected code in accordance with the frequency of occurrence of that symbol. For the purposes of the present discussion, the "symbols" may comprise characters, bytes, pixel values or any other data element that can be conveniently processed. In some embodiments, Symbol-frequency translation is performed using a predetermined symbol frequency table. In some cases, the symbol frequency table may be computed by analysing a training data set composed of network traffic within a selected period of time, and counting the number of occurrences of each symbol within the training data set.

In some embodiments, the size of each code corresponds with that of each symbol. Thus, for example, in an embodiment in which each symbol of the raw data is a byte value, each code will also be a byte value. Preferably, the codes used to replace each symbol of the raw data are selected such that the most frequently occurring symbols are replaced by codes which (in binary representation) are runs of a common bit-value. For example, the most frequently occurring symbol may be replaced by (hexadecimal) 00; the second most commonly occurring symbol by "01"; and so on to the least commonly occurring symbol, which may be replace by "FF".

In some embodiments, symbol translation can be implemented in hardware, by loading the frequency table into a random-access memory look-up table (RAM-LUT), addressed by each successive symbol of the received data. This arrangement is advantageous in that the symbol-translation step can be reliably executed at very high speed, so that data transmission latency is minimized. In addition, a frequency table can be updated, or replaced by a different frequency table entirely, using well known RAM-page swapping techniques.

Run-length encoding the symbol frequency transformed data involves replacing each code with a three-part sequence as follows:

Three or more identical symbols, X, in a row are replaced with the three-part sequence M, N, X, where: M is a marker to indicate the coding, X is the value of the symbol in question, and N is the run length of that symbol. It will be appreciated that the coding marker M can be any arbitrary value. In the following description, M is taken to be a byte, which is arbitrarily assigned a value of (hexadecimal) FF.

A single symbol "X" or a double symbol (e.g. "X X") remain unchanged for all symbol values except those that correspond to the coding marker M (i.e. "FF" in the present example). The single symbol FF becomes the two-part sequence FF, 01; and the double symbol FF, FF becomes the two-part sequence FF,02.

In an embodiment in which N is a byte value, the maximum value of N=256. Since runs of more than 256 symbols are possible, the largest of the values from table 2 below is used, and any run length left over is encoded separately.

TABLE 2

| N (written in decimal) | run length |
| --- | --- |
| 0, 1, 2 | not used |
| 3 ... 127 | N |
| 128 | not used |
| 129 ... 192 | (N − 128) * 128 |
| 193 ... 254 | (N − 192) * 1024 |
| 255 (=FF) | not used |

For example, if the raw data contains a run of 1234 identical symbols (X) in a row, and these symbols were symbol-frequency translated to the code (decimal) 111, then run-length encoding this run would yield two 3-part sequences as follows: FF,137,111 FF,82,111. In the first of these sequences, N=137, which encompasses the first (N−128) *128=9*128=1152 symbols of the raw data, and the second term encompasses the remaining N=82 symbols.

As may be appreciated, run length encoding in this manner changes the length of the data. In most cases it reduces the length. This encoding is used because raw data with long run lengths will fail in the hardware implementation of the next stage, the Burrows-Wheeler transform.

Conventional techniques can be used to Burrows-Wheeler transform the run-length encoded data. In some embodiments the run-length encoded data may be subdivided into blocks of predetermined length, and each block Burrows-Wheeler transformed separately.

In its pure form, the Burrows-Wheeler transform produces an output block of length B (corresponding to the length of each block) and a pointer (with values from 0 to B−1) to the end-of-file (EOF) marker of the block. The Burrows-Wheeler transform yields an ordered string of characters (which in this case include individual symbols as well as run-length encoded sequences) that follows the frequency distribution of symbols within the original data.

One method of analysing this distribution is to allocate each character of the Burrows-Wheeler transformed data block to a respective one of a plurality of segments, using the count values of the corresponding original symbol contained in the symbol frequency table. It is possible to make this allocation such that the sum of the respective count values for the characters assigned to any given segment is approximately equal.

For example, in an embodiment in which the characters Burrows-Wheeler transformed data are byte values, one possible 16 way segmentation might be as set out below in table 3:

TABLE 3

| Segment index | Character values (written in decimal) |
|---|---|
| 1 | 0 |
| 2 | 1 |
| 3 | 2 |
| 4 | 3 |
| 5 | 4 . . . 5 |
| 6 | 6 . . . 7 |
| 7 | 8 . . . 10 |
| 8 | 11 . . . 14 |
| 9 | 15 . . . 20 |
| 10 | 21 . . . 30 |
| 11 | 31 . . . 45 |
| 12 | 46 . . . 60 |
| 13 | 61 . . . 100 |
| 14 | 101 . . . 150 |
| 15 | 151 . . . 220 |
| 16 | 221 . . . 255 |

In this example, segment 12 contains the characters (having decimal values in the range 46 . . . 60) that, taken together, represent approximately 1/16 of the symbols within the original data. In the output block of the Burrows-Wheeler Transform, the segments are those sets of characters that have the "subsequent" characters in the corresponding segmentation defined above. "Subsequent" characters means subsequent in the input block to the Burrows Wheeler Transform (BWT). These sets will be contiguous in the output block, by the property of the BWT. The sets will also each have about the same number of characters, according to the above-noted method of choosing the segmentation. This is property is useful in embodiments in which the Burrow-Wheeler transform is implemented in hardware.

In embodiments in which the context is identified using a multi-bit value, the least significant bits of the context identifier may refer to the index number of each segment, while the most significant bits indicate the kind of data context presented. For example, the context may be identified using a 7-bit value, of which the 4 least significant bits correspond with the segment index, and the 3 most significant bits define the kind of data context presented. In some embodiments, the most significant bits may be calculated by considering the characters of a segment in the Burrows-wheeler output block, to identify the symbol (of that segment) that occurs most often within the raw data. In the case of a tie, one of the tied symbols can be selected using a desired method such as, for example, the symbol that appears first. The identified character can then be used as the address to a context look up table that outputs the most significant bits of the context identifier.

The above-noted process yields a multi-bit value which explicitly identifies the block context for each segment of the Burrows-Wheeler output. For an embodiment in which the Burrows-wheeler output is divided into 16 segments, and the context is identified using a 7-bit identifier, a total of 128 possible contexts exist.

It should be noted that the above-described allocation of characters to respective different segments does not involve reordering the Burrows-Wheeler output. Naturally, such a re-ordering of characters would destroy the reversibility of the Burrows-Wheeler transform.

For the purposes of optimization of compression, a respective Huffman encoding dictionary can be computed for each context, resulting in a total of 128 dictionaries in the case of a 7-bit context identifier. Each dictionary can be computed by processing a training data set (which may comprise either a set of predetermined training data files, or network traffic within a predetermined time period) as described above to obtain the segmented Burrows-Wheeler transformed data block. Each segment can be examined to obtain the appropriate context identifier, as described above, and then the characters of the Burrows-Wheeler transformed data block within each segment used to compute elements of the Huffman encoding dictionary for that context. A conventional method may be used to compute the Huffman encoding dictionary for any given context, using the characters assigned to the associated segment(s).

In some embodiments, the foregoing analysis for computing the respective encoding dictionary for each context can be performed in the network hub. This arrangement is convenient, in that all of the network traffic traverses the hub, so that the hub is readily able to compute the symbol frequency table using all of the network traffic within a predetermined time period as the training set.

As may be appreciated, it is possible that the segments of any given Burrows-Wheeler transformed data block may not contain enough characters to enable computation of the encoding dictionaries of one or more contexts. In such cases, the computation of an encoding dictionary may be performed using the segment contents of multiple Burrows-Wheeler transformed data blocks. The above-described method ensures that if two segments (in respective different Burrows-Wheeler transformed data blocks) yield the same context identifier, then the characters within those two segments will be sufficiently self-similar that they can be treated together for the purpose of efficient Huffman encoding.

Once the encoding dictionary for a given context has been computed, it can be forwarded to each branch node in the network for use in compressing/decompressing network traffic. For example, at a transmitting node of the network, outgoing traffic can be processed as described above to obtain the segmented Burrows-Wheeler output, and each segment examined to obtain the respective context identifier, again as described above. For each segment, the segment's context identifier can then be used to select the appropriate dictionary, which is then used to Huffman encode all of the characters of the Burrows-Wheeler transformed data block that have been assigned to that segment.

The resulting Huffman encoded data block can then be checked to determine whether or not it is indeed smaller than the original (raw) data. If it is, then the encoded data block is transmitted through the network. Otherwise, the original data is sent.

It may be noted that, since the encoding dictionaries are applied on a per-context basis, and since each context (and its dictionary) is known to every node in advance, it is not necessary for a transmitting node to append the dictionary to each encoded segment. Rather, it is sufficient to append the context identifier, so that a receiving node can select the appropriate dictionaries as needed to decode incoming network traffic.

The embodiments of the invention described above are intended to be illustrative only. The scope of the invention is therefore intended to be limited solely by the scope of the appended claims.

I claim:

1. A method of compressing data traffic for transmission through a network, the method comprising:
   in a hub node of the network:
      analysing data traffic within the network to identify each one of plurality of contexts of data;
      computing, for each identified context, a respective optimal dictionary for encoding data traffic conforming to that context; and
   in a branch node of the network:
      identifying a respective block context of a block of data to be transmitted through the network; and
      encoding the block of data using the respective optimal dictionary computed by the hub node for the context corresponding to the identified block context.

2. The method as claimed in claim 1, wherein each one of the plurality of contexts of data traffic within the network comprises a respective one of a set of predetermined categories of the data traffic.

3. The method as claimed in claim 1, wherein the set of predetermined categories of data traffic within the network comprises: biological and medical data; database chunks; machine executables; images; mixed text and binary files; text files; and binary data.

4. The method as claimed in claim 1, wherein each one of the plurality of contexts of data traffic within the network comprises a respective block context derived from a characteristic of the data traffic within the network.

5. The method as claimed in claim 4, wherein computing a respective optimal dictionary for each one of a plurality of contexts of data traffic comprises, for each block of data transmitted through the network:
   byte-translating the block of data using a predetermined frequency table;
   Run-Length encoding the byte-translated data block;
   Burrows-Wheeler transforming the Run-Length Encoded data block; and
   computing an optimal dictionary for Huffman-encoding the Burrows-Wheeler transformed data block.

6. The method as claimed in claim 5, further comprising:
   using a first suffix segment of the Burrows-Wheeler transformed data block to identify the respective block context; and
   storing the computed dictionary in association with the identified respective block context.

7. The method as claimed in claim 5, further comprising storing the first suffix segment of the Burrows-Wheeler transformed data block in association with the stored dictionary, for use as an identifier of the respective block context.

8. The method as claimed in claim 5, wherein identifying the block context of the block of data comprises;
   byte-translating the block of data using a predetermined frequency table;
   Run-Length encoding the byte-translated data block;
   Burrows-Wheeler transforming the Run-Length Encoded data block; and
   using a first suffix segment of the Burrows-Wheeler transformed data block to identify the block context.

9. The method as claimed in claim 1, wherein encoding the block of data comprises Huffman-encoding the block of data.

10. The method as claimed in claim 1, wherein the step of computing a respective optimal dictionary for each one of a plurality of contexts of data traffic, is performed in accordance with a predetermined schedule.

11. The method as claimed in claim 1, wherein the step of computing a respective optimal dictionary for each one of a plurality of contexts of data traffic, is performed when a total traffic load in the network exceeds a predetermined threshold.

12. The method as claimed in claim 1, wherein the step of computing a respective optimal dictionary for each one of a plurality of contexts of data traffic, further comprises transmitting the computed optimal dictionary to at least one branch node of the network.

* * * * *